(12) United States Patent
Mosley

(10) Patent No.: US 7,199,343 B2
(45) Date of Patent: Apr. 3, 2007

(54) SPATIAL OPTICAL MEMORY

(76) Inventor: Nile Mosley, 41 Whakarite Road, Ostend, Waiheke Island, 1240 (NZ)

( * ) Notice: Subject to any disclaimer, the term of this patent is extended or adjusted under 35 U.S.C. 154(b) by 5 days.

(21) Appl. No.: 10/905,292

(22) Filed: Jan. 19, 2005

(65) Prior Publication Data

US 2006/0012668 A1    Jan. 19, 2006

(30) Foreign Application Priority Data

Sep. 9, 2002   (NZ) .................................... 521222
Aug. 7, 2003   (WO) ..................... PCT/NZ03/00172

(51) Int. Cl.
*G02B 7/04*   (2006.01)
*G01J 1/04*   (2006.01)
*G11C 13/00*   (2006.01)
*G11B 11/00*   (2006.01)
*H01J 3/14*   (2006.01)

(52) U.S. Cl. ........................... 250/201.5; 250/227.11; 250/216; 365/106; 369/13.01

(58) Field of Classification Search ................ 250/228, 250/216, 227.11, 201.5; 359/726, 727, 728, 359/729, 730, 731; 365/106, 234; 369/13.01
See application file for complete search history.

(56) References Cited

U.S. PATENT DOCUMENTS

| 4,487,478 | A | * | 12/1984 | Jackson ...................... 359/601 |
| 6,108,023 | A | | 8/2000 | Seino ......................... 347/236 |
| 6,166,866 | A | * | 12/2000 | Kimura et al. .............. 359/729 |
| 6,376,837 | B1 | | 4/2002 | Itabashi et al. ............. 250/234 |

* cited by examiner

*Primary Examiner*—Georgia Epps
*Assistant Examiner*—Pascal M. Bui-Pho
(74) *Attorney, Agent, or Firm*—David A. Guerra

(57) ABSTRACT

A device for storing photons between one and a plurality of reflected surfaces, and the storage of information, in particular in the form of digital data, being provided by creating at least one circulating memory using the storage device as a delay line. Each device consists of one or a plurality of photon sources, using any wavelength of light, one or a plurality of photon detectors and one or a plurality of reflective surfaces. The injected photons are delayed from reaching the output by one or a plurality of reflections from one surface of the device to the same or another surface of the device, each reflection extending the distance traveled for each photon, thereby inducing a delay.

1 Claim, 7 Drawing Sheets

SPATIAL OPTICAL MEMORY

FIELD OF THE INVENTION

The present invention relates in general to optical data storage devices and methods, and concerns the storage of photons by means of reflection between one or a plurality of highly reflected surfaces.

BACKGROUND OF THE INVENTION AND RELATED ART

Typically the storage of photons has an analogy to electron storage such as the well known capacitor memory cell. Difficulty in producing such devices has arisen from the physical problems of containing a photon or a stream of photons. To date most approaches for storing photons are either based on the effects of optically bistability or the utilization of long fiber loops.

Devices that utilize the use of optical bistability are both technologically complex and expensive, with much of the early work motivated by the notion that optics could be used to avoid some of the intrinsic speed limitations of electronic storage analogs. These devices rely on electro-optic conversion and hence the storage of an electron. Devices that utilize the use of fiber loops exist in the form of sequential storage pipes used to house a sequential stream of photons flowing in a re-circulating path in a first in first out fashion. These fiber loops are used as delay lines and are typically referred to as "Programmable Photonic Fiber Loop Memory", A. Dickson et al. Proceedings of the 16th Australian Conference on Optical Future Technology, pp 274–277, 1991.

For future data storage, it is desirable to have a photon storage device as a counter part or replacement for today's analogous electronic memory devices. These should be capable of meeting the high speed data storage requirements expected for the next generation of information processing hardware. In addition to speed, such devices should also meet the expected high storage capacity (bit density) requirements for advanced processing applications. Finally the importance of error reduction from limited alpha emissions as well as radiation hardened capability would be desirable for space exploration.

SUMMARY OF THE INVENTION

It is an object of the present invention to provide an apparatus for optically storing photons for the purpose of carrying information.

This objective has been accomplished by one or a plurality of photon sources injecting a plurality of photons into the entrance of the said storage device. Once inside the device, the injected photons are, where necessary, focused into a region that allows for the said photons to be reflected a plurality of times from one highly reflective surface to another highly reflective surface. The number of complete reflections within a device will vary depending on device geometry, with each reflection extending the total distance traveled for each injected photon within the said device. On exiting the said device, each reflected photon is, where necessary de-focused, and selectively detected by one or a plurality of photon detectors.

The principles of the present invention allow for the construction of devices and systems which should be capable of delivering high speed, high bit density and radiation hard storage requirements expected for the next generations of information processing hardware. Moreover, in doing so, these principles do not require a light source of a specific frequency, or photon sources and detectors of a specific kind, except to the extent that compatibility between the photon source and detector must be maintained, as known in the art.

BRIEF DESCRIPTION OF DRAWINGS

For a more complete understanding of the present invention, and advantages thereof, reference is now made to the following descriptions taken in conjunction with the accompanying drawings in which.

GENERAL DESCRIPTION

The principles of the present invention and their advantages are best understood by referring to the illustrated embodiment depicted in FIGS. 1–7 of the drawings, in which like numbers designate like parts.

For the sake of simplicity, it is assumed that all reflected surfaces contained herein, unless otherwise stated, are deemed to be that of a high reflectance, essentially reflecting 100% of all incident photons.

For the sake of simplicity, it is further assumed in the following, that a light pulse represents one bit of information. This is not necessarily so, but for most applications this approach is reasonable.

For the sake of simplicity, it is further assumed that a surface represents a set of points in space which resembles a portion of a plane in the neighborhood of each of its points, and is the case if the surface is the image of a sufficiently regular mapping of a set of points in the plane into $E^3$. To which, and for the sake of simplicity, a surface is taken to be a point of reflection, be it on a closed connected surface such as a sphere or torus, or on a surface patch. For the purpose of this invention, a reflective surface is therefore deemed to be a patch on which photons are reflected, be that patch part of a connected surface such as the interior of a sphere or a cylinder, or part of a disconnected surface separate from any other surface.

For the sake of simplicity, let all angles and all space coordinates be relative to the device and plane of the device within an xyz coordinate system in $E^3$.

Figure 1:
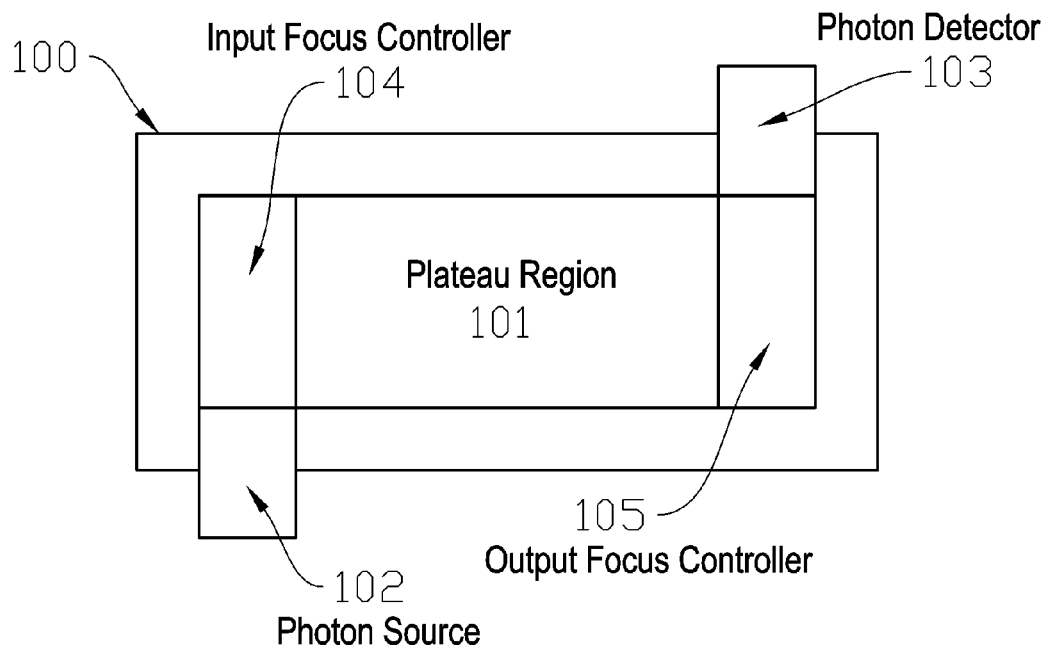
FIG. 1. shows a block diagram for the said storage device.

FIG. 1 is a block diagram depicting the basic device architecture 100. The device is comprised of at least one Photon Source 102, at least one Photon Detector 103, where necessary, at least one Input Focus Controller 104, where necessary, at least one Output Focus Controller 105, and at least one Plateau Region 101. It should be noted that not all geometries pertinent to this invention will require the use of 103 and 104.

Figure 2:
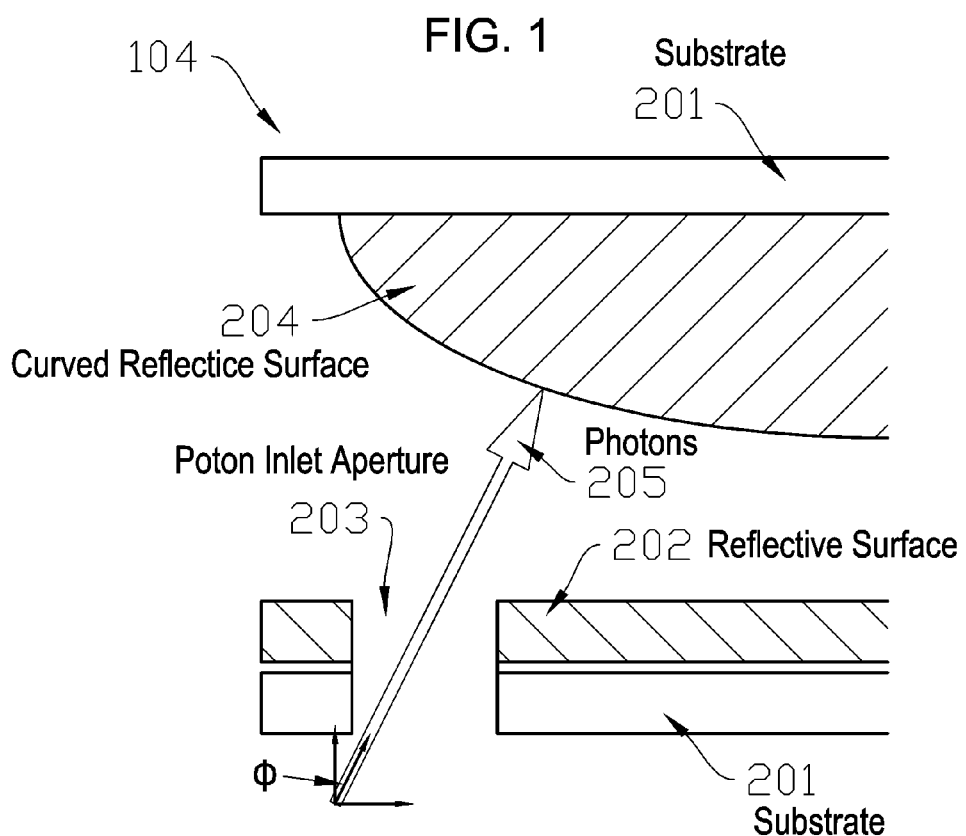
FIG. 2. shows the said storage device input, and focus control unit.

FIG. 2 is a block diagram depicting the basic Input Focus Controller 104. The purpose of 104 is to prevent newly injected photons from re-entering 203, and/or interfering with the injection process. Without such a mechanism, the angle of reflection for photons entering the plateau region 101, would be too large to facilitate a suitable storage mechanism. Thus, 104 is comprised of a substrate 201, used to house the device, a mirrored surface 202, a curved mirrored surface 204 with a decreasing rate of curvature heading toward the Plateau Region 101, and a Photon Inlet Aperture 203. Photons 205 from a suitable Photon source 102, are injected into 203, with an angle $\phi$ to the vertical plane of the device. $\phi$ is the Source Tuning variable.

Figure 2A:
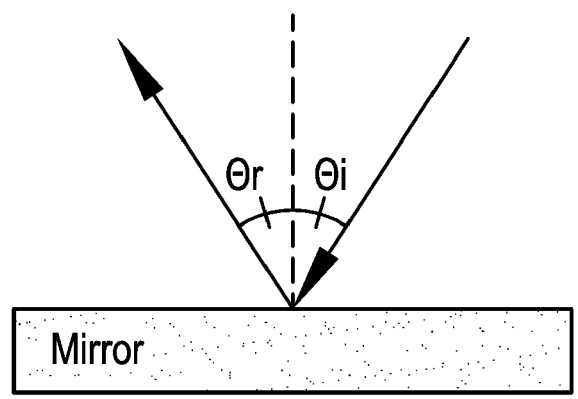
FIG. 2a. shows the relationship between the angle of incidence and the angle of reflection on surface.

From FIG. 2a the law of reflection states that the angle of incidence of a wave or stream of particles reflecting from a boundary, conventionally measured from the normal to the interface (not the surface itself), is equal to the angle of reflection, measured from the same interface.

$$\theta_i = \theta_r \quad (1)$$

The law of reflection holds for both flat and curved reflective surfaces, where in a curved surface the tangent to the curved surface is taken as the flat boundary to the incident wave source.

Figure 3:
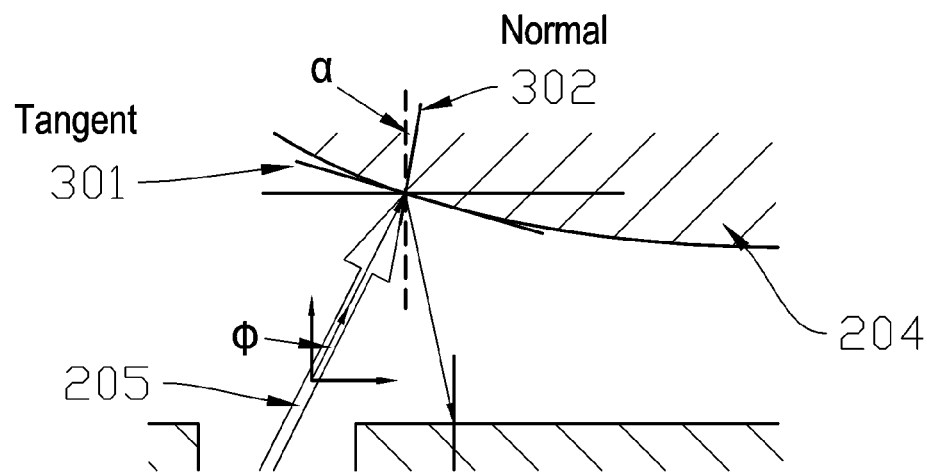
FIG. 3. shows details of the first photon reflection off a curved surface.

As such from FIG. 3, the tangent 301 and normal 302 at the point of reflection for the incoming photons 205 are effectively rotated through an angle $\alpha$, where $\alpha$ is related to the curvature of 204 at the point of reflection. By inspection, it can be seen that the new angle of incidence to 204 after reflection is:

$$\theta_i = \phi - \alpha \quad (2)$$

where $\phi$ is the initial angle of 205, and $\alpha$ is the effective angle of rotation caused by the curvature of 204, and measured from the normal of 204 against the normal of 205. The point on 204 chosen for the incident 205 is such that $\alpha < \theta$.

As such the angle of reflection will now be, from equation 1:

$$\theta_r = \phi - \alpha \quad (3)$$

Figure 4:
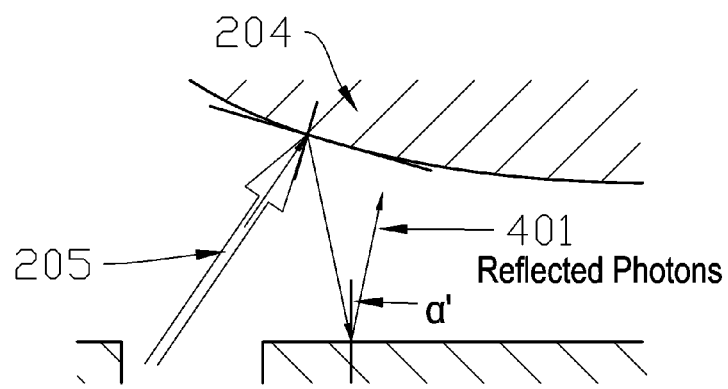
FIG. 4. shows details of the second photon reflection of a flat surface.

FIG. 4 shows the reflected photons 401 with the new angle of incidence and angle of reflection as shown by equations 2 and 3. However, when the photons strike 204 again, there will be a further decrease in $\theta i$ from the new rotation value $\alpha'$, again obtained from the tangential normal for 204 against the normal for 401, a result of 204's changing curvature. As before, the point on 204 for the incident 205 is such that $\alpha + \alpha' < \theta_i$. There is therefore a relationship between each subsequence angle of incidence $\theta$ and curvature C of 204 at the point of incidence such that:

$$\theta \propto C \quad (4)$$

where as $C \to 0$, $\theta \to \infty$ and as $C \to \infty$, $\theta \to \infty$ Therefore and in general, photons move across the surface of 204, with the curvature of 204 decreasing. As the curvature of 204 decreases, the relative angle of incidence for the next reflection decreases. This in turn will move the reflected photons to a new position along 204 to experience yet a smaller still angle of curvature, so even further decreasing the angle of incidence for the next reflection. This continued decrease in the relative angle of incidence continues until a desired angle of incidence is reached at the entry point to the Plateau region 101. In so doing, and with each reflection, the relative step size, that is the distance between two successive reflections on the same surface, will decrease in proportion to the decrease in the angle of incidence. This can be expressed first by relating the focus angle to the sum of all incremental changes in $\alpha$ as a limiting case:

$$\theta_f = \phi_i \pm \sum_0^n \alpha_n \quad (5)$$

where $\phi_i$ the initial incident photon angle at 203, n is the number of reflections for the incident photons to reach and enter 101, and $\alpha_n$ is the angle of effective rotation at each point of reflection, applied to the incident photons as a direct result of the changing curvature of 204. The $\pm$ is dependant on the focus control input (-) and the focus control output (+).

The limiting factor is $$\phi_i > \sum_0^n \alpha_n$$

such that $\theta_f$ is always positive and non-zero. $\theta_f$ is the critical angle used in conjunction with other variables, to adjust the volume of photon storage within the device.

The iterative process of moving the photons along 104 can also be expressed as:

$$\theta_{fn} = \theta_{fn-1} \pm \alpha_{n-1}$$

where $\theta_{fn}$ is the angle of reflection from 204 after the $n^{th}$ iteration. Again the $\pm$ is dependant on the direction of curvature relative to photon movement, the focus control input is (-) and the focus control output is (+).

Figure 6:
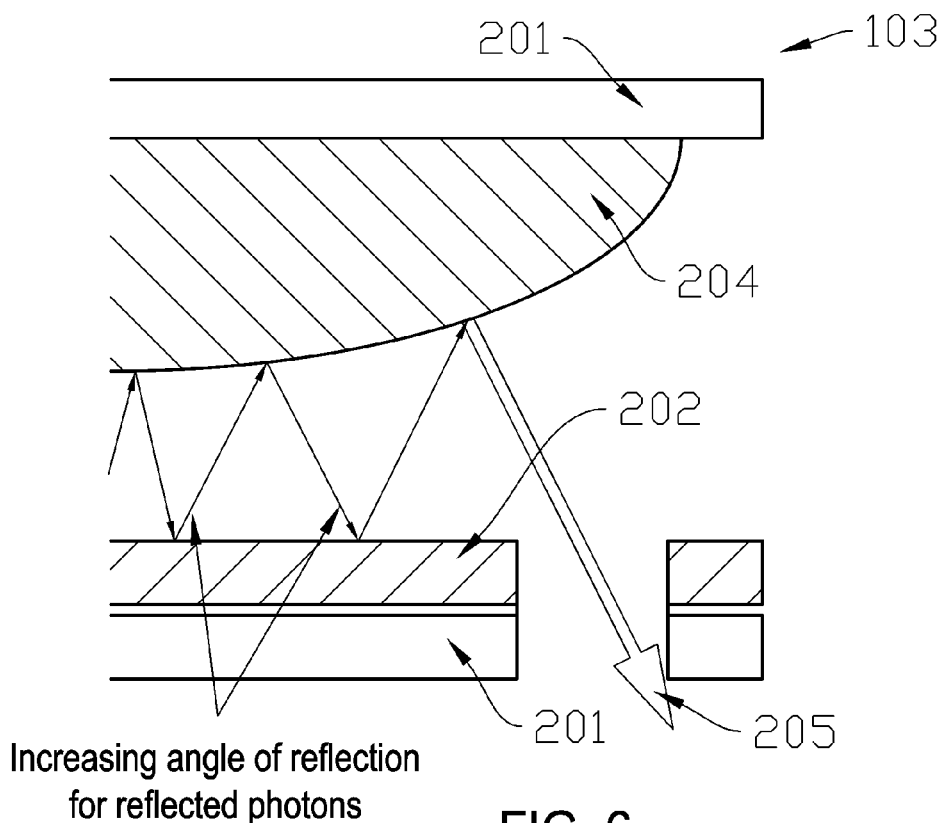
FIG. 6. shows the output of the said device, the photon detector and the output focus control unit.

As already discussed, the same principles and equations are applicable to photons entering the device in FIG. 2, using the focus input controller, or the converse where photons exit the device using the focus output controller in FIG. 6.

Adjustments to the focusing of 104 can be made by changing the initial angle of incidence $\phi$ for 205, changing the location of the first reflection point on 204 or by changing the curvature of 204. The curve used in the above example for 204 is based on an ellipse.

Figure 2B:
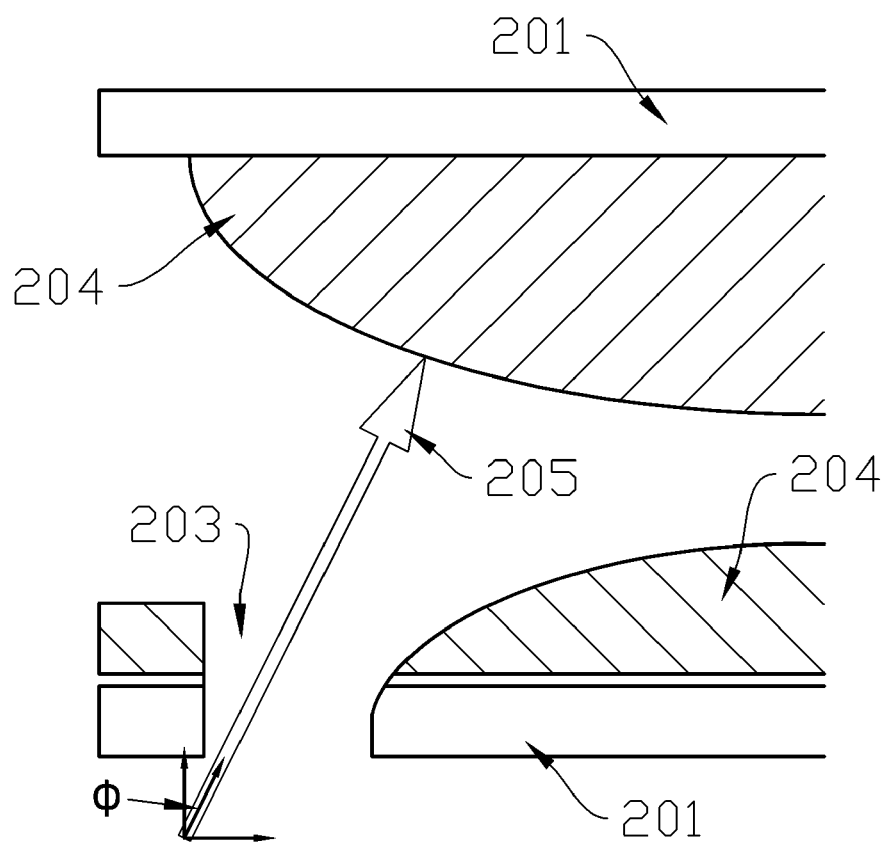
FIG. 2b. shows a variation of design whereby two curved surfaces are used to comprise the focus control unit.

FIG. 2b shows a variation for 104 using two curved mirrors to focus 205. This increases the rate of tuning 104. Now at each point of reflection the angle of rotation induced by the curvature of 204 occurs with each reflection instead of every other reflection as with FIG. 2.

Figure 2C:
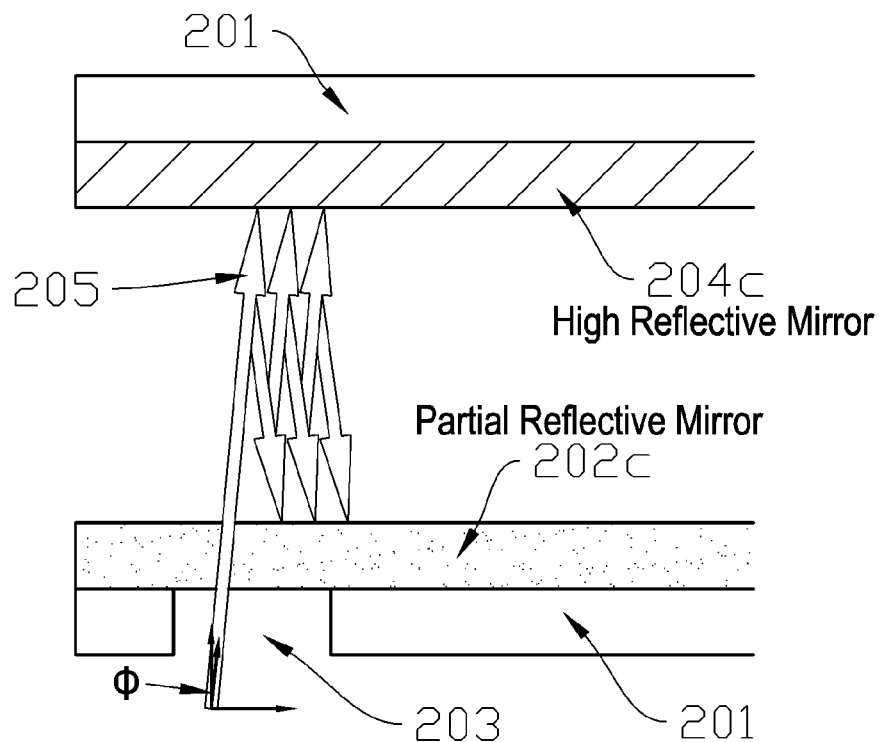
FIG. 2c shows a variation of design for the focus control unit using a partial mirror.

FIG. 2c shows a further variation for 104 using a partial mirror as the means to focus the injected photons. In this instance, the partial mirror allows photons to enter the device through the Photon Inlet Aperture 203, but does not allow the reflected photons from 204c to re-enter 203. It is suggested that such arrangement would still require the Output Focus Control as shown in FIG. 6.

Figure 5:
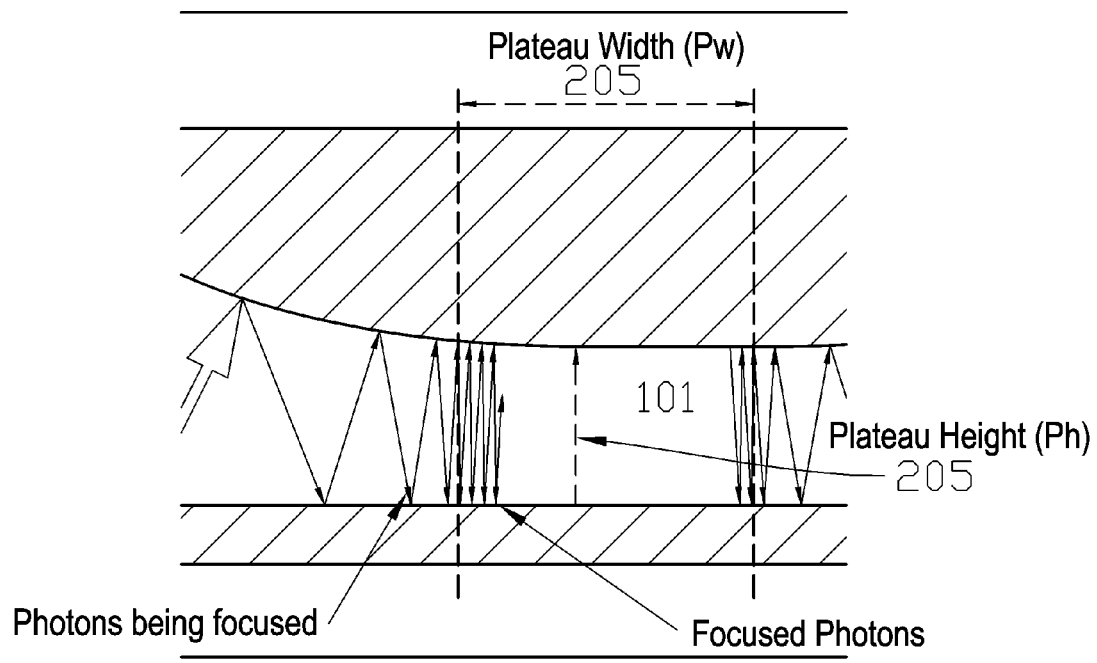
FIG. 5. shows photons entering the Plateau region. For clarity, the full stream of photons is not shown in the figure. Instead, photons at the beginning and the end of the Plateau region are shown.

In FIG. 5, the plateau region 101 is where the bulk of the injected photons are stored. The structure itself is comprised of two opposing reflective surfaces housed on a substrate 201, that store photons by reflecting an input photon first off one surface, then off an opposing surface. This process is repeated until the photons effectively walk themselves out of 101 with a step size governed by the angle of incidence/reflection set on entry to 101 by the Input Focus Controller.

The surfaces of 101 need not necessarily be parallel, nor the angle of incidence constant. However, photons moving from one surface to another with each reflection should at no time touch the same xyz space coordinate twice, within the device and with each refresh of the device.

The amount of photons that can be stored by this device is therefore governed by three principle factors. The Plateau Length 501, the Plateau Width 502 and the focused angle of incidence of the source photons 205 on entering 101. The latter of these values is calculated from equation 5.

Figure 5A:
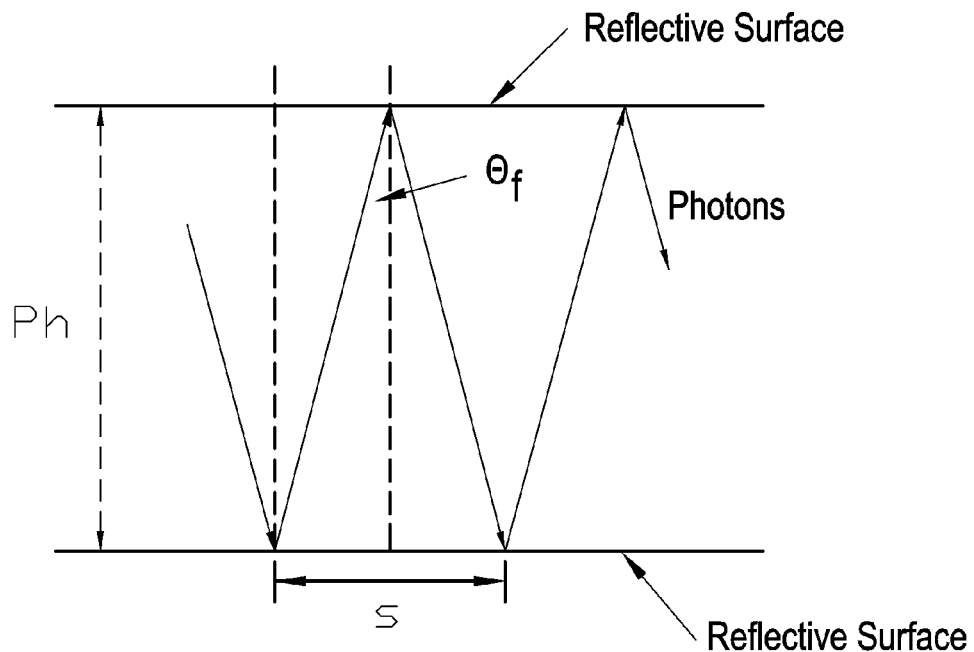
FIG. 5a. shows photon propagation within the plateau region.

Ordinarily, it is not feasible to calculate the number of actual photons stored within the device. However, we can calculate data storage capacity given the frequency of 205's oscillation, with the assumption that one bit of information is stored with each pulse of 205, the value of the Plateau Regions height $P_h$ and width $P_w$. As such, we can calculate the volume of data stored as:

Using FIG. 5a, the distance s traversed lengthways in each half of a reflective step by photons within 101 is:

$$\tan \theta_f = \frac{s}{P_h} \quad (6)$$

$$s = \tan \theta_f P_h \quad (6a)$$

The distance traveled from one surface to another is, from simple Pythagoras:

$$l = \sqrt{P_h^2 + s^2} \quad (7)$$

Total distance traveled by photons within the plateau region is therefore the length of 101 divided by the step size distance (2s) between each successive reflection on the same surface, multiplied by twice the distance traveled (2 complete reflections) from one surface to the other. Total distance is shown as:

$$d_t = \frac{P_w}{2s} 2l \quad (8)$$

On substitution and in terms of $\theta_f$ this gives:

$$d_t = \frac{P_w}{\tan \theta_f} \sqrt{(1 + \tan^2 \theta_f)} \quad (9)$$

and in terms of s gives:

$$d_t = \frac{P_w}{s} \sqrt{P_h^2 + s^2} \quad (10)$$

Given a data frequency f data storage volume can be calculated as a function of the frequency or rate of data pumped into the system within a given time t.

$$V_d = ft = \frac{fd_t}{c} = \frac{fP_w}{cs} \sqrt{P_h^2 + s^2} \quad (11)$$

FIG. 6 shows the Output Focus Controller 105, essentially a reverse process to that employed for the Input Focus controller 104. A curved reflective surface 204 with an increasing rate of curvature leading away from the plateau region 101 slowly increases the angle of incidence/reflection of photons that have propagated through 101. As photons exit 101, their reflected angle, gradually increases along with the curvature of 204 until a suitably placed photon detector 103 at the Photon Outlet Aperture receives the internally stored photons.

As storage duration within the device is limited by the dimension of 101, re-circulation of the stored photons using a delay line principle may be necessary to facilitate an effective store of data. Each new input of photons to the device constitutes a device refresh.

Figure 7:
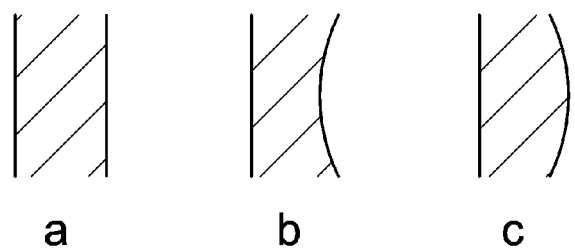
FIG. 7. shows the three different types of reflective surfaces than can be employed by the said device.

The actual reflective surface used by this device can differ in a number of ways. In FIG. 7, there are 3 principle surfaces that can be used. FIG. 7a, a flat surface, FIG. 7b a concave surface and FIG. 7c a convex surface.

This invention utilizes the storage of photons between one or a plurality of reflected surfaces. As such a number of possible curves and configuration types are suitable both in a single reflective plane or across multiple reflective planes. Not all geometries will require an input focus control 104 or an output focus control 105. A description of variation follows.

Figure 8A:
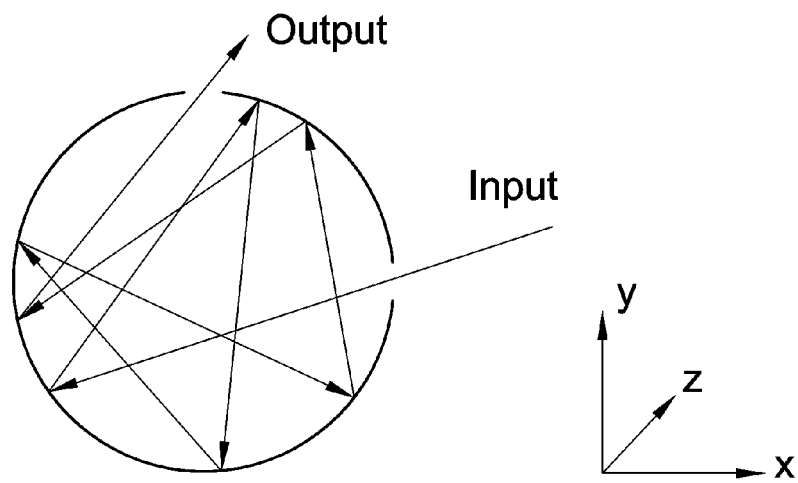
FIGS. 8a, b and c show different surface configurations for the said device.

FIG. 8a—Single continuous surface in the xy-plane and one of the reflective surfaces from FIG. 7 in the z-plane. Figure in 8a show that of a ring, but any continues surface in x, y will suffice.

Figure 8B:
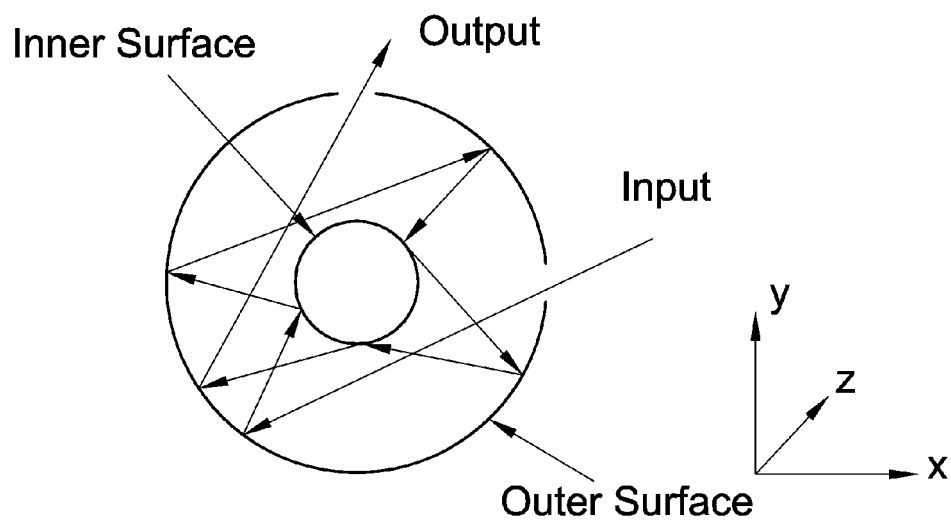

FIG. 8b—Double continuous surface in the xy-plane. This geometry shows a configuration that has one inner reflective surface and one outer reflective surface in the reflection plane. The figure in 8b shows a torus, but any continuous outer surface in x, y and any continues inner surface in x, y will suffice. Both inner and outer surface would use one of the surfaces in the z-plane, as shown in FIG. 7.

It should be noted that the geometries shown in FIGS. 8a and 8b do no require that photons travel from one surface to another in the same plane, and that to a limited degree imposed by the height of the surface in the z-plane, photons may be able to travel out of the xy-plane and into the z-plane between different surfaces.

Figure 8C:
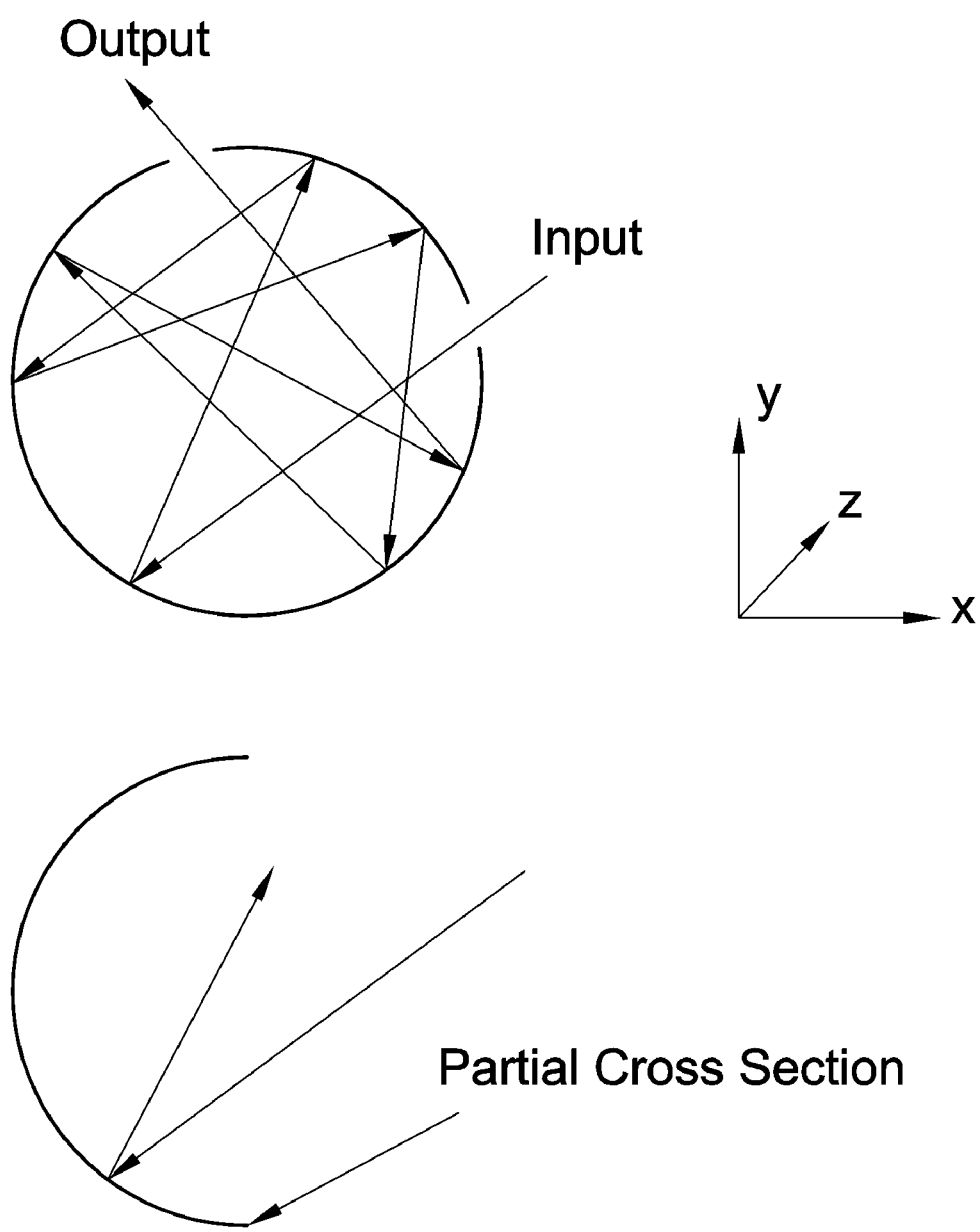

FIG. 8c—Single hollow surface in xyz. This geometry is in effect a hollow structure, such as a sphere, cone, cylinder or torus, with a reflective surface on the inner wall.

Such geometries would allow photons to reflect beyond the single plane, so extending the geometric distance traveled while in the storage device. In the example shown in FIG. 8c, only one reflection is shown in the cross section. All other reflections occur at different locations on the cross section for this example.

Multiple source and detectors: There is in general no limit to the number of photon sources and photon detectors for any given design geometry, save for the actual physical space required for their placement.

Size and dimensions: There in general no limit to the size and geometry of this device save for the physical limits of current production technology.

What is claimed is:

1. A method of optically storing information comprising the steps of:

(a) providing a photon storage device comprising: a substrate used to house said photon storage device; at least one photon source adjacent to one end of said substrate; at least one input focus controller housed on said substrate adjacent said photon source, said input focus controller having at least one photon inlet aperture defined through said substrate and adapted to receive therethrough photons from said photon source, a reflective surface attached to said substrate adjacent said aperture, and a curved reflective surface attached to said substrate opposite said aperture and having a decreasing rate of curvature heading away from said aperture; at least one plateau region housed on said substrate and in communication with said input focus controller, said plateau region being adapted to receive reflected photons from said first and second reflective surfaces of said input focus controller, said plateau region having at least two opposing and parallel reflective surfaces attached to said substrate and adapted to reflect the photons from said input focus controller along the length of said plateau region; at least one output focus controller housed on said substrate and in communication with said plateau region opposite said input focus controller, said output focus controller having at least one aperture defined through said substrate and adapted to receive therethrough photons, a reflective surface attached to said substrate adjacent said aperture, and a curved reflective surface attached to said substrate opposite said aperture and having an increasing rate of curvature leading away from said plateau region; and at least one photon detector adjacent said aperture of said output focus controller;

(b) converting an electrical signal to a photon pulse using said photon source, wherein said photon pulse corresponds to one bit of information;

(c) determining the amount of photons to be stored by said photon storage device, wherein said photon storage amount being related to the length of said plateau region, the width of said plateau region, and a focused angle of incidence of the photons exiting said input focus controller and entering said plateau region;

(d) injecting photons from said photon source through said aperture of said input focus controller at an angle of incidence to a first reflection point on said curve reflective surface of said input focus controller;

(e) adjusting said curvature of said curved reflective surface of said input focus controller, said first reflection point, and said angle of incidence to create said desired focused angle of incidence of the photons entering said plateau region;

(f) adjusting the length of said plateau region to produce said determined photon storage amount;

(g) adjusting the width of said plateau region to produce said determined photon storage amount;

(h) orientating said reflective surfaces of said plateau region so as to repeatedly reflect the photons along the length of said plateau region toward said output focus controller;

(i) exiting the photons through said aperture of said output focus controller; and (j) detecting the photons exiting from said aperture of said output focus controller using said photon detector.

* * * * *